(12) United States Patent
Ueda et al.

(10) Patent No.: US 10,502,605 B2
(45) Date of Patent: Dec. 10, 2019

(54) FLOW RATE MEASUREMENT SYSTEM

(71) Applicant: Daifuku Co., Ltd., Osaka-shi (JP)

(72) Inventors: Toshihito Ueda, Hinocho (JP); Jun Tanaka, Hinocho (JP); Shinsuke Kawamura, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 175 days.

(21) Appl. No.: 15/891,635

(22) Filed: Feb. 8, 2018

(65) Prior Publication Data
US 2018/0224311 A1 Aug. 9, 2018

(30) Foreign Application Priority Data

Feb. 8, 2017 (JP) .................................. 2017-021571

(51) Int. Cl.
*G01F 7/00* (2006.01)
*H01L 21/677* (2006.01)
*G01F 9/00* (2006.01)

(52) U.S. Cl.
CPC .............. *G01F 7/005* (2013.01); *G01F 9/008* (2013.01); *H01L 21/67769* (2013.01)

(58) Field of Classification Search
CPC ............ G01F 1/76; G01F 7/005; G01F 9/008; G01N 11/02; G01N 33/0009; H01L 21/67028; H01L 21/67253; H01L 21/67393; H01L 21/673; H01L 21/67769

USPC ................................................ 73/23.2, 23.24
See application file for complete search history.

(56) References Cited

U.S. PATENT DOCUMENTS

| | | | |
|---|---|---|---|
| 2008/0156069 A1* | 7/2008 | Murata | G01D 21/00 73/19.04 |
| 2010/0294397 A1* | 11/2010 | Kishkovich | G03F 1/66 141/66 |
| 2015/0000372 A1 | 1/2015 | Otsuka et al. | |

FOREIGN PATENT DOCUMENTS

JP 201512040 A 1/2015

* cited by examiner

*Primary Examiner* — Benjamin R Schmitt
(74) *Attorney, Agent, or Firm* — The Webb Law Firm

(57) ABSTRACT

A flow rate measurement system measures, by using a flow rate measurement device, a flow rate of cleaning gas in a container storage facility including: a storage rack including supporting portions; a transport device that transports a container to the supporting portions; and a gas supply device that supplies the cleaning gas to the container supported by the supporting portions. The transport device and the flow rate measurement device are connected via a power line communicatively by wire or wireless. The flow rate measurement device measures the flow rate of the cleaning gas in a state in which the transport device has transported the flow rate measurement device and the flow rate measurement device is placed on a target supporting portion.

7 Claims, 8 Drawing Sheets

FLOW RATE MEASUREMENT SYSTEM

CROSS-REFERENCE TO RELATED APPLICATION

This application claims priority to Japanese Patent Application No. 2017-021571 filed Feb. 8, 2017, the disclosure of which is hereby incorporated in its entirety by reference.

FIELD OF THE INVENTION

The present invention relates to a flow rate measurement system.

BACKGROUND

Container storage facilities that include a storage rack including a plurality of supporting portions, a transport device that transports a container to any one of a plurality of supporting portions, and a gas supply device that supplies cleaning gas to containers respectively supported by the plurality of supporting portions. Such a container storage facility is used, for example, for large-scale storage for containers housing semiconductor wafers, reticles, and the like in semiconductor factories. Since the semiconductor wafers and the reticles stored in the containers undergo contamination due to natural oxidation or the like, there is a need to accurately measure and appropriately manage the flow rate of the cleaning gas supplied to the containers in order to prevent such contamination.

For example, JP 2015-12040A (Patent Document 1) discloses an inspection device that includes an inspection supply port joined to a supply nozzle of a gas supply device, and measures the flow rate of cleaning gas flowing from the inspection supply port while being supported by the supporting portion in place of a container. Since the inspection device measures the flow rate of the cleaning gas while being supported by the supporting portion as with an ordinary container, it is possible to accurately measure the flow rate of the supplied cleaning gas in the supporting portions by sequentially transferring the inspection device to the supporting portions, and performing the flow rate measurement. Note that an inspection control device that performs various determinations based on measurement results and stores measurement results, determination results and the like is also mounted to the inspection device, and the driving power for the inspection device is supplied from a small battery separately mounted to the inspection device.

However, the range of the supporting portions that can be measured together using the inspection device is limited by the battery capacity. Accordingly, there may be cases where all of the supporting portions cannot be measured together. In such cases, a measurement operation is discontinuously performed while carrying out battery replacement in the middle of the operation. Each of the data pieces on the measurement results obtained in each batch is loaded onto a working computer, and these data pieces are integrated at the end, thus obtaining measured data pieces in one-to-one correspondence with all of the supporting portions. In this manner, the inspection device of Patent Document 1 requires measurement processing for a plurality of batches executed to obtain a complete set of measured data with battery replacement performed in between, and data processing in the working computer. Accordingly, there is room for improvement in inspection efficiency.

SUMMARY OF THE INVENTION

It is desired to accurately and efficiently measure the flow rate of the cleaning gas supplied to the containers placed on the supporting portions of the storage rack.

A flow rate measurement system according to the present disclosure measures, by using a flow rate measurement device, a flow rate of cleaning gas supplied from a gas supply device in a container storage facility including: a storage rack including a plurality of supporting portions; a transport device that transports a container to a target supporting portion selected from the plurality of supporting portions; and the gas supply device that supplies the cleaning gas to the container supported by each of the plurality of supporting portions, wherein the transport device and the flow rate measurement device are connected via a power line communicatively by wire or wireless, and the flow rate measurement device measures the flow rate of the cleaning gas in a state in which the transport device has transported the flow rate measurement device in place of the container and the flow rate measurement device is placed on the target supporting portion.

With this configuration, in a state in which the flow rate measurement device is placed on the target supporting portion, the flow rate measurement is performed in the same state as the state in which the container is supported by the supporting portion. Accordingly, it is possible to accurately measure the flow rate of the supplied cleaning gas. While a transport device that transports a container is usually connected, for example, to a power system or the like and power is steadily supplied therefrom, the transport device and the flow rate measurement device are connected via a power line. Accordingly, power is also stably supplied to the flow rate measurement device via the transport device. Consequently, battery replacement, which poses a problem in such a case where power is supplied to the flow rate measurement device from a small battery, for example, is not required, making it possible to efficiently perform the data measurement. Furthermore, while a transport device that transports a container is usually communicatively connected to a control device, the transport device and the flow rate measurement device are communicable with each other. Accordingly, measured data obtained by the flow rate measurement device can be sequentially transmitted to the control device via the transport device. Consequently, the processing for integrating the measured data on the control device side, which poses a problem in such a case where the flow rate measurement is performed in a plurality of batches, is not required, making it possible to efficiently obtain a complete set of measured data.

Further features and advantages of the present disclosure will become apparent from the following description of illustrative and non-limiting embodiments with reference to the drawings.

DETAILED DESCRIPTION OF PREFERRED EMBODIMENTS

Figure 1:
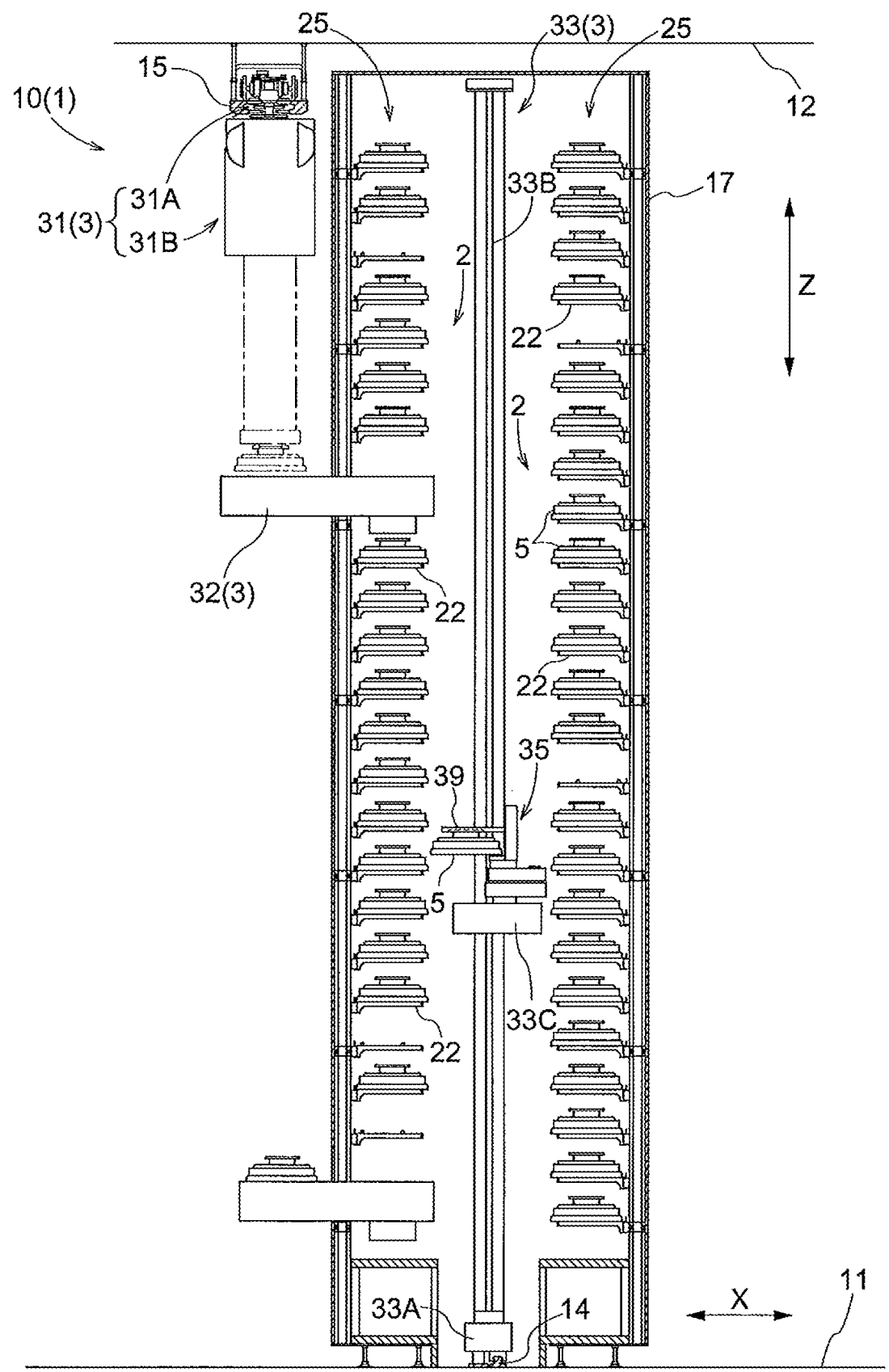
FIG. 1 is a cross-sectional view of a container storage facility.

An embodiment of a flow rate measurement system will be described with reference to the drawings. A flow rate measurement system 1 of the present embodiment is used in a container storage facility 10 including a storage rack 2 including a supporting portion 22, a transport device 3 that transports a container 5 to the supporting portion 22, and a gas supply device 4 that supplies cleaning gas to the container 5 supported by the supporting portion 22. The container storage facility 10 is used for temporarily storing raw materials or intermediate products, or for storing finished articles, for example, during a waiting time before they are subjected to the next step in the manufacturing process of industrial products, for example. In such a container storage facility 10, the flow rate measurement system 1 measures the flow rate of the cleaning gas supplied from the gas supply device 4, by using a flow rate measurement device 6 included in the flow rate measurement system 1.

As shown in FIG. 1, the container storage facility 10 is installed inside a clean room. The clean room may be configured to be a downflow-type clean room in which a gas flows from the ceiling portion 12 side toward the floor portion 11 side. A traveling rail 14 is constructed on the floor portion 11. A ceiling rail 15 is constructed on the ceiling portion 12.

The storage rack 2 is installed in an internal space of a partition wall 17 provided between the floor portion 11 and the ceiling portion 12. A pair of storage racks 2 are provided so as to oppose each other across a stacker crane 33 constituting the transport device 3. In the present embodiment, the direction in which the pair of storage racks 2 are arranged is referred to as a "front-rear direction X", and the transverse width direction of the storage racks 2 is referred to as a "left-right direction Y".

Figure 2:
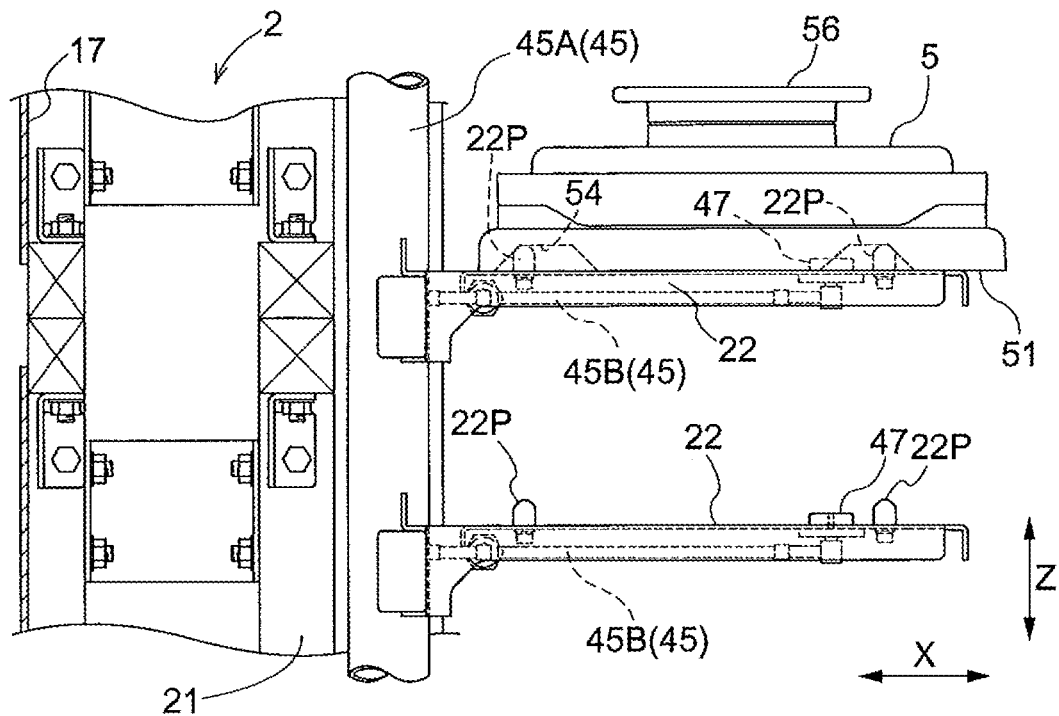
FIG. 2 is a side view of supporting portions.

Each storage rack 2 includes a plurality of struts 21 aligned in the left-right direction Y, and a plurality of supporting portions 22 that is fixed so as to be aligned in the up-down direction Z, across a pair of struts 21 adjacent in he left-right direction Y (see FIG. 2). In this manner, the storage rack 2 includes a plurality of supporting portions 22 in a state in which the supporting portions 22 are arranged in the up-down direction Z and the left-right direction Y. Each supporting portion 22 can be constituted, for example, by a shelf plate that is formed in a U-shape in plan view and has a cut-out portion at the center. "U-shape" means a shape of the letter "U" of the English alphabet, or a shape that can be generally considered to a U-shape as a whole although having some differently shaped portion (the same applies to other expressions and the like that are used with "-shape" in the following description).

As shown in FIG. 2, each supporting portion 22 supports a container 5 from below in a state in which the container 5 is placed thereon. In addition, the supporting portion 22 supports the flow rate measurement device 6 from below in a state in which the flow rate measurement device 6 is placed thereon (see FIG. 6). The U-shaped supporting portion 22 supports three sides of the bottom surface of the container 5 and the flow rate measurement device 6. Protruding pins 22P protruding upward are provided in a plurality of locations of the supporting portion 22.

In the present embodiment, a reticle pod that houses an EUV (extreme ultraviolet) lithography reticle (photomask) is used as the container 5. The container 5 includes a body portion 51 that houses a reticle, and a flange portion 56 provided above the body portion 51. The body portion 51 is formed in the shape of a rectangular solid, and more specifically, is formed in the shape of a rectangular solid having a square shape in plan view. The container 5 has a predetermined weight in a predetermined weight balance.

Recesses 54 that are recessed upwardly in the up-down direction Z are provided on the bottom surface of the body portion 51 of the container 5 in a plurality of locations corresponding to the positions at which the protruding pins 22P are formed on the supporting portion 22. The inner surface of each recess 54 constitutes an inclined surface. Even if the position of the container 5 relative to the supporting portion 22 is shifted in the horizontal direction when the container 5 is placed on the supporting portion 22, the relative position is corrected to a proper position by engaging action between the inner surfaces of the recesses 54 and the protruding pins 22P.

Figure 3:
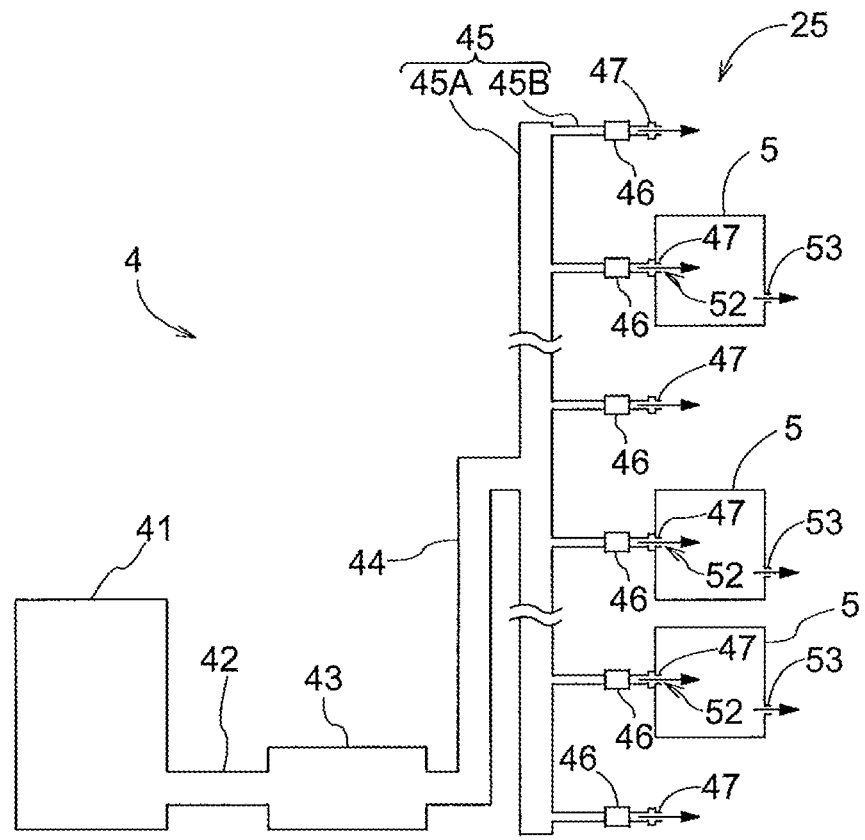
FIG. 3 is a schematic view of a gas supply device.

As shown in FIG. 3, each container 5 is provided with a supply port 52 and an exhaust port 53. The schematic view of FIG. 3 lacks accuracy since high priority is given to ease of understanding. However, actually, both the supply port 52 and the exhaust port 53 are formed on the bottom surface of the container 5. A discharge nozzle 47 of the gas supply device 4 is fitted to the supply port 52 in a state in which the container 5 is supported by the supporting portion 22.

The transport device 3 transports the container 5 to a target supporting portion 22S, which is a specific supporting portion 22 selected from among a plurality of supporting portions 22. The target supporting portion 22S is, for example, a destination supporting portion that is designated as a destination supporting portion 22 in a transport instruction generated by a control portion 8, which will be described later. For example, in the case of performing the flow rate measurement for cleaning gas, a supporting portion 22 on which the flow rate measurement device 6 is placed as a supporting portion 22 to be measured may be the target supporting portion 22S. As shown in FIG. 1, the transport device 3 includes a ceiling guided vehicle 31, a conveyor 32, and a stacker crane 33.

The ceiling guided vehicle 31 includes a traveling member 31A that travels along the ceiling rail 15, and a transfer unit 31B supported so as to be suspended from the traveling member 31A. The transfer unit 31B transports a container 5 in and out to and from the conveyor 32 while holding a flange portion 56 provided at the upper portion of the container 5. The conveyor 32 is configured to be, for example, a roller or belt-type conveyor, and moves the container 5 between the internal space and external space of the partition wall 17. The stacker crane 33 includes a traveling truck 33A that travels along the traveling rail 14 (the left-right direction Y), a mast 33B provided upright on the traveling truck 33A, and an elevating member 33C that moves up and down while being guided by the mast 33B.

The transfer device 35 that transfers the container 5 to and from the supporting portion 22 is installed on the elevating member 33C.

Figure 4:
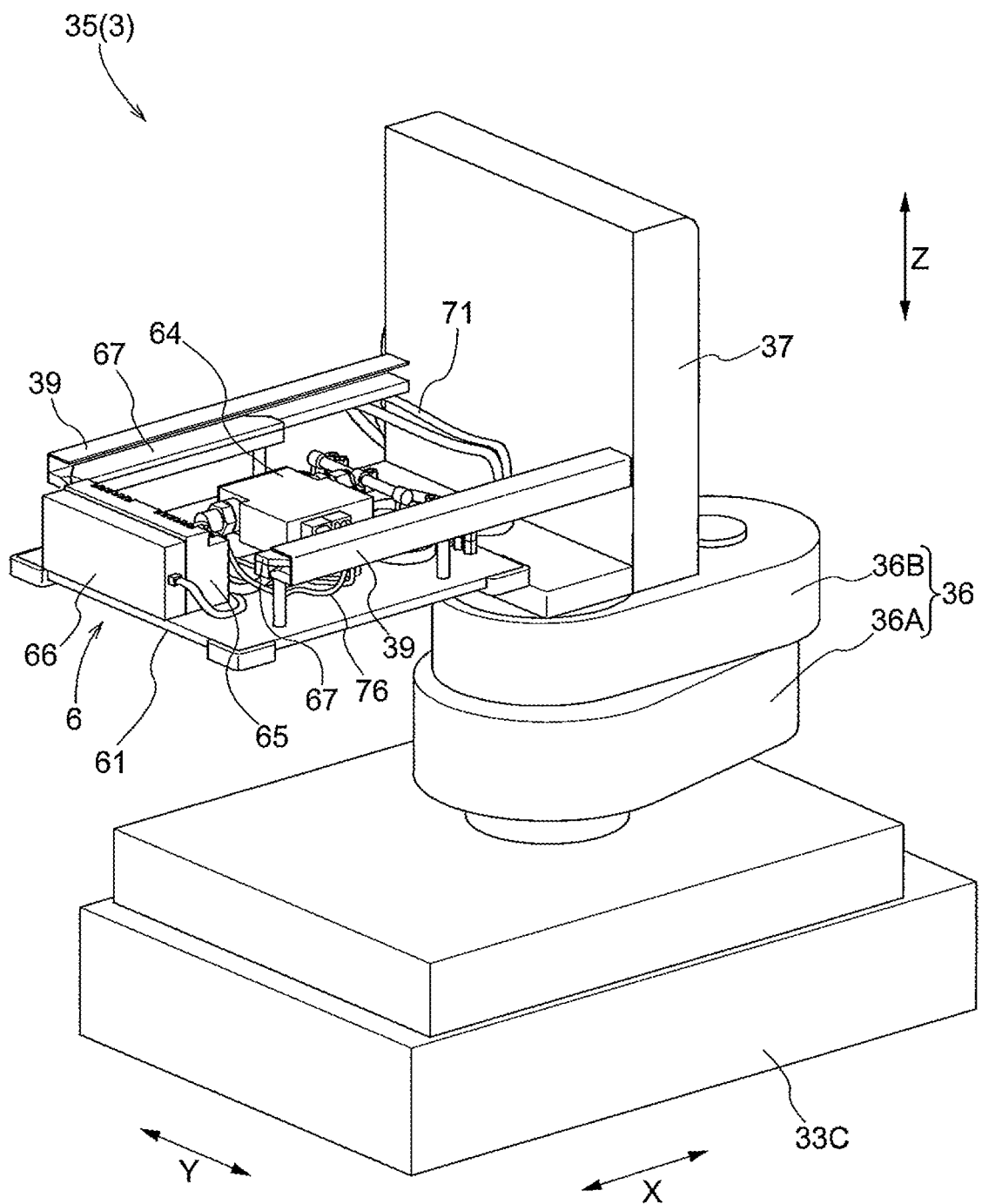
FIG. 4 is a perspective view of a transfer device and a flow rate measurement device.

As shown in FIG. 4, the transfer device 35 includes an extendable arm 36, a support platform 37, and a gripping portion 39. The extendable arm 36 is provided so as to be extendable in the front-rear direction X. The extendable arm 36 may be configured as a SCARA arm as shown in the drawing, or may configured as a sliding arm. The extendable arm 36 of the present embodiment includes a first arm 36A and a second arm 36B that are pivotably coupled to each other. The first arm 36A is pivotably supported by the elevating member 33C of the stacker crane 33 at an end opposite to the portion coupled to the second arm 36B. A block-shaped support platform 37 is fixed to an end of the second arm 36B that is opposite to the portion coupled to the first arm 36A. The support platform 37 is configured to be capable of reciprocating in the front-rear direction X by the extendable arm 36 extending or contracting in the front-rear direction X.

At a predetermined position of the support platform 37 in the up-down direction Z, a pair of gripping portions 39 protruding in the front-rear direction X are fixed in a cantilevered state. Each gripping portion 39 is formed in an angular U-shape in front view, and the pair of gripping portions 39 are fixed such that their opening sides oppose in the left-right direction Y. The pair of gripping portions 39 can grip the flange portion 56 of the container 5 and a gripped portion 67, which will be described later, of the flow rate measurement device 6. Then, the transfer device 35 can transfer the container 5 between the elevating member 33C and the supporting portion 22 in a state in which the flange portion 56 is gripped by the pair of gripping portions 39, or can move the flow rate measurement device 6 to the supporting portion 22 side in a state in which the gripped portion 67 is gripped by the pair of gripping portions 39.

The gas supply device 4 supplies cleaning gas to the containers 5 respectively supported by the plurality of supporting portions 22. The gas supply device 4 supplies cleaning gas into a container 5 in each of the plurality of supporting portions 22 when the container 5 is supported thereby. Here, each storage rack 2 of the present embodiment is divided into a plurality of storage compartments 25 each including a plurality of supporting portions 22, and the gas supply device 4 is configured to supply cleaning gas for each of the storage compartment 25 one by one. For example, each storage compartment 25 may be composed of a group of supporting portions 22 belonging to the same column, or may be composed of a group of supporting portions 22 belonging to the same row. Alternatively, the storage compartment 25 may be composed of, for example, a group of supporting portions 22 disposed over a plurality of columns and a plurality of rows. Then, the gas supply device 4 is configured to supply, in parallel, cleaning gas whose flow rate has been adjusted by the flow rate adjustment device 43 used in common for a plurality of supporting portions 22 included in one storage compartment 25.

As shown in FIG. 3, the gas supply device 4 includes a gas supply source 41, a mother pipe 42, a flow rate adjustment device 43, a connecting pipe 44, and a supply pipe 45. The gas supply source 41 is a tank for storing cleaning gas, and is shared by a plurality of supply pipes 45. The cleaning gas is, for example, an inactive gas such as a nitrogen gas or an argon gas, or a clean and dry air from which dust and moisture have been removed. The number of flow rate adjustment devices 43 that corresponds to the number of the storage compartments 25 are connected to the gas supply source 41 via the mother pipe 42. The flow rate adjustment device 43 includes a flow rate sensor for measuring the flow rate of the cleaning gas, a flow rate control valve that changes and adjusts the flow rate of the cleaning gas, and an internal control portion that controls the operation of the flow rate control valve. The flow rate adjustment device 43 controls the operation of the flow rate control valve on the basis of results of detection by the flow rate sensor, and adjusts the flow rate of the cleaning gas to be a predetermined target flow rate.

The flow rate adjustment device 43 is connected, via the connecting pipe 44 and the supply pipe 45, to discharge nozzles 47 installed on supporting portions 22 constituting the supporting portions 22 belonging to the corresponding storage compartment 25. The supply pipe 45 is configured as a branched pipe, and the supply pipe 45 includes one main pipe 45A for each storage compartment 25, and a plurality of branch pipes 45B branched from the main pipe 45A. A filter 46 is provided in an intermediate portion of each branch pipe 45B. When dust has entered the cleaning gas flowing through the supply pipe 45, the dust is removed by the filter 46. A discharge nozzle 47 is provided at a distal end portion of the branch pipe 45B, and the cleaning gas is discharged from the discharge nozzle 47. In this manner, the gas supply device 4 supplies the cleaning gas from the gas supply source 41, via the branched supply pipe 45 including the branch pipes 45B, to each of the supporting portions 22 for each storage compartment 25.

As described above, the discharge nozzle 47 is fitted to the supply port 52 of the container 5 supported by each of the supporting portions 22. A gas supply open/close valve (not shown) is provided at the supply port 52 of the container 5. The gas supply open/close valve is biased in a close state by a biasing member such as a spring. When the cleaning gas is discharged from the discharge nozzle 47 in a state in which the discharge nozzle 47 is fitted to the supply port 52, the gas supply open/close valve is opened by the pressure of the cleaning gas, and the cleaning gas is supplied from the supply port 52 into the container 5. In addition, a gas exhaust open/close valve (not shown) is also provided at the exhaust port 53 of the container 5. The gas exhaust open/close valve is also biased in a close state by a biasing member such as a spring. When a predetermined amount of cleaning gas is supplied to increase the internal pressure of the container 5. The gas exhaust open/close valve is opened by the pressure of the cleaning gas, and the gas (e.g., the air, water vapor, or the cleaning gas that has been already charged) inside the container 5 is discharged from the exhaust port 53.

As described above, when the article stored in the container 5 is a reticle as described above, the reticle may undergo contamination due to natural oxidation or the like. Therefore, in order to prevent such contamination, it is necessary to accurately measure and appropriately manage the flow rate of the cleaning gas supplied to each of the containers 5. For this purpose, the flow rate measurement system 1 includes the flow rate measurement device 6 that measures the flow rate of the cleaning gas supplied from the gas supply device 4.

Figure 5:
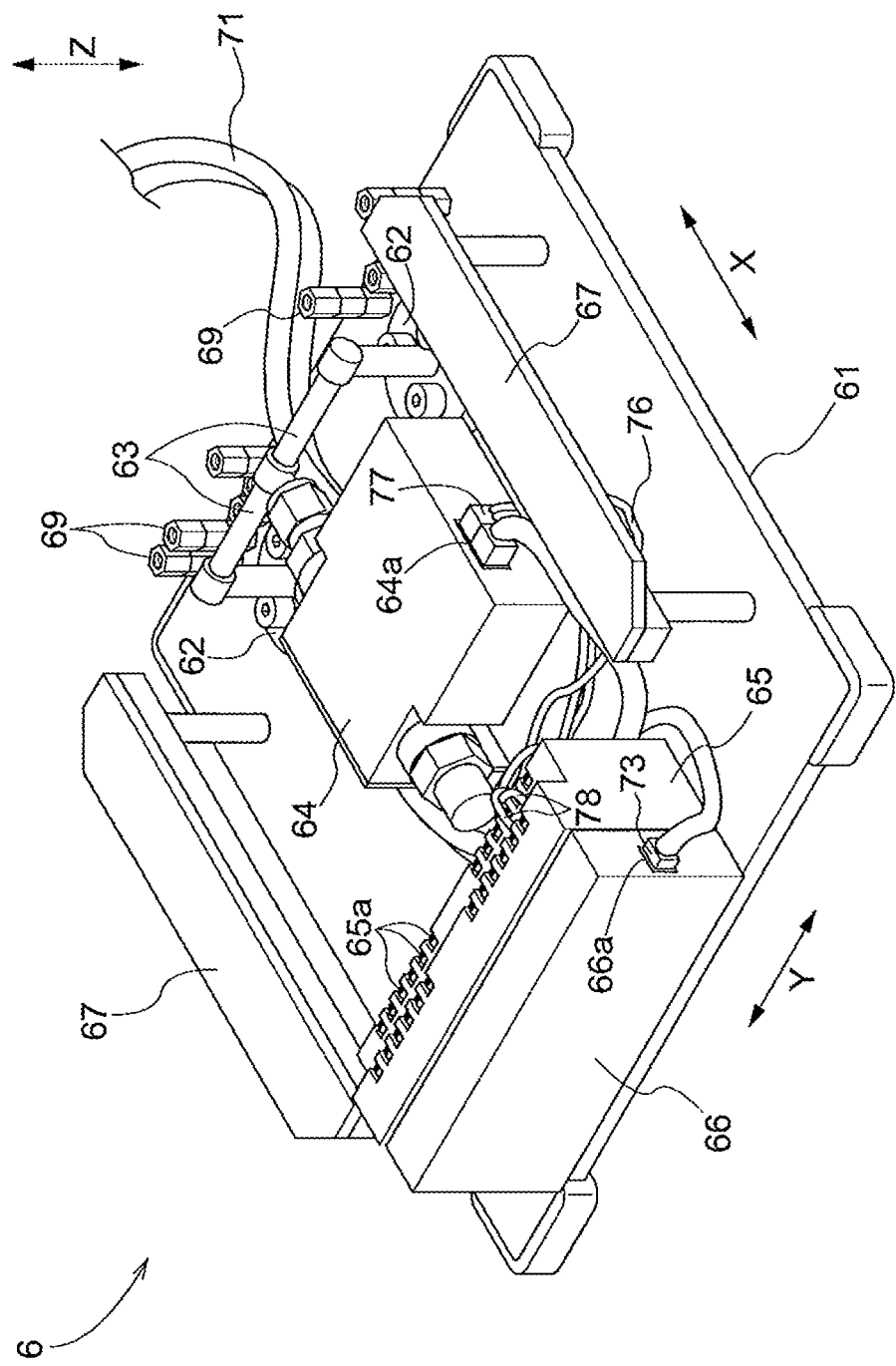
FIG. 5 is a perspective view of a flow rate measurement device.

As shown in FIG. 5, the flow rate measurement device 6, as a whole, is formed in a rectangular solid shape simulating the shape of the container 5. The flow rate measurement device 6 includes a support substrate 61, a supply port 62, a gas supply pipe 63, a flowmeter 64, a terminal block 65, an input/output device 66, and gripped portions 67. The support substrate 61 is formed in a square shape in plan view (more specifically, a rectangular shape whose longer sides are slightly longer than the shorter sides; see FIG. 7). The supply port 62, the gas supply pipe 63, the flowmeter 64, the terminal block 65, the input/output device 66, and the gripped portions 67 are fixed to the support substrate 61. Considering the support substrate 61 in correspondence with the bottom surface of the body portion 51 of the container 5, the supply port 62 is provided at the position corresponding to the supply port 52 of the container 5, and the gripped portions 67 are provided at the positions corresponding to opposite side portions, in the left-right direction Y, of the container 5 at the flange portion 56.

The supply port 62 is connected to the discharge nozzle 47 in a state in which the flow rate measurement device 6 is supported by the supporting portion 22. A gas supply open/close valve (not shown) similar to the supply port 52 of the container 5 is provided at the supply port 62 of the flow rate measurement device 6. When the cleaning gas is discharged from the discharge nozzle 47 in a state in which the discharge nozzle 47 is fitted to a supply port 62, the gas supply open/close valve is opened by the pressure of the cleaning gas, and the cleaning gas is supplied from the supply port 62 to the gas supply pipe 63 connected to the supply port 62. The flow rate measurement device 6 is provided with a plurality of (in the present example, two) supply ports 62, and the gas supply pipes 63 extending from the respective ones of the plurality of supply ports 62, are connected to the flowmeter 64 after they merge. The flowmeter 64 measures the flow rate (flow rate per unit time) of the cleaning gas flowing through the inside of the gas supply pipe 63

The terminal block 65 includes a plurality of connection terminals 65a. The input/output device 66 includes a communication port 66a. In the present embodiment, the terminal block 65 and the input/output device 66 are fixed in alignment in the front-rear direction X in a state of being electrically connected and in a state of being communicable with each other. A first cable 71, which will be describe later, is connected to the input/output device 66, and a second cable 76, which will be describe later, is connected to the terminal block 65.

In the present embodiment, the flowmeter 64 is fixed at the central portion of the support substrate 61. The supply port 62, the gas supply pipe 63, the terminal block 65, the input/output device 66, and the pair of gripped portions 67 are fixed to the support substrate 61 so as to surround the flowmeter 64 therebetween. More specifically, the supply port 62 and the gas supply pipe 63 are disposed separately from the terminal block 65 and the input/output device 66 in the front-rear direction X such that the flowmeter 64 is interposed therebetween. Also, one of the pair of the gripped portion 67 is disposed separately from the other in the left-right direction Y such that the flowmeter 64 is interposed therebetween. The elements constituting the flow rate measurement device 6 are provided so as to be distributed on the support substrate 61, and the flow rate measurement device 6 is configured to have a weight comparable to that of the container 5 and a weight balance similar to that of the container 5. Needless to say, it is difficult to set the weight and the weight balance of the flow rate measurement device 6 to be identical to those of the container 5. Therefore, a weight 69 for adjusting at least one of the weight and the weight balance is removably provided on the flow rate measurement device 6.

Figure 6:
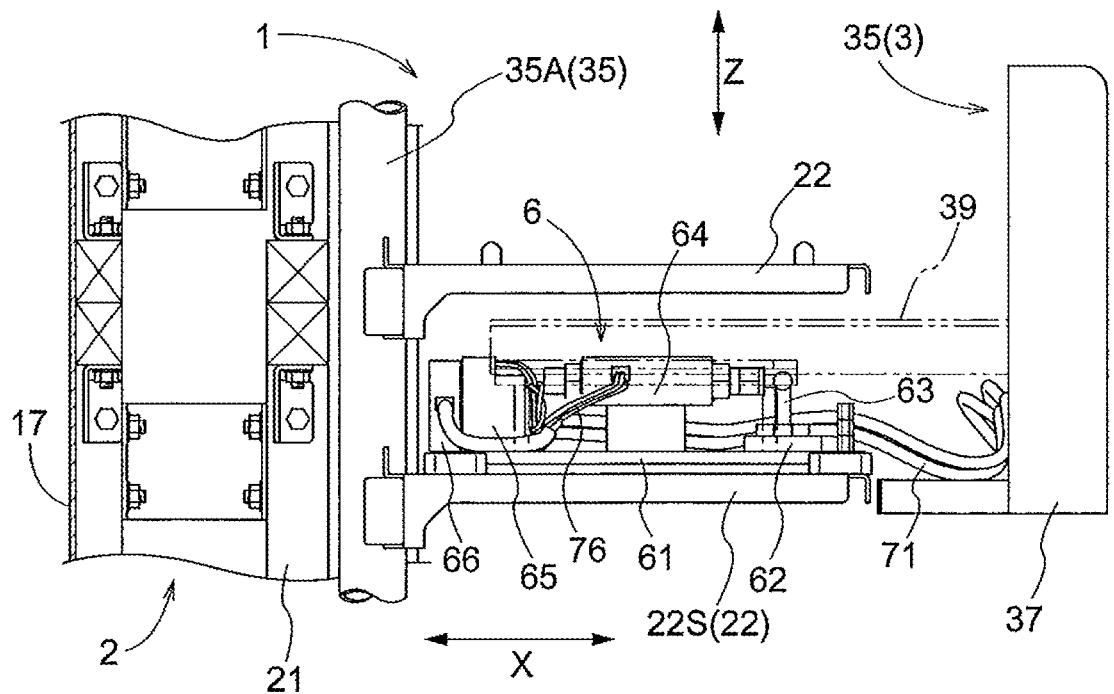
FIG. 6 is a side view of a supporting portion and the flow rate measurement device during flow rate measurement.

The flow rate measurement system 1 of the present embodiment uses a flow rate measurement device 6 simulating the container 5, and measures the flow rate of the cleaning gas by using the flow rate measurement device 6 in a state in which the flow rate measurement device 6 is placed on the supporting portion 22 in place of the container 5 (see FIG. 6). Since the flow rate measurement is performed while reproducing a situation where the cleaning gas is actually introduced into the container 5, it is possible to accurately measure the flow rate of the cleaning gas supplied to the container 5. Then, upon completion of the flow rate measurement in a given supporting portion 22, the transport device 3 transports the flow rate measurement device 6 to another supporting portion 22, places the flow rate measurement device 6 on the supporting portion 22, and performs flow rate measurement in that state. By repeating this operation, it is possible to accurately measure the flow rate of the cleaning gas supplied to the container 5 in each of the supporting portions 22.

Meanwhile, power is required to operate the flowmeter 64. Therefore, in a flow rate measurement system having the conventional specifications, a small battery is separately provided in the flow rate measurement device 6 in order to supply the operating power to the flowmeter 64. However, with such a configuration, the range of the supporting portions 22 that can be measured together is limited by the battery capacity. Therefore, there may be cases where the flow rate measurement cannot be performed together for all of the supporting portions 22. In such cases, the measurement operation is discontinuously performed while carrying out battery replacement in the middle of the operation. Accordingly, extra time is required for battery replacement, resulting in a reduced inspection efficiency.

In the flow rate measurement system having the conventional specifications, each of the data pieces on the measurement results obtained in each batch is loaded onto a working computer, and these data pieces are integrated at the end, thus obtaining measured data pieces in one-to-one correspondence with all of the supporting portions 22. This requires data processing in the working computer, and extra time required for the data processing results in a further reduction in the inspection efficiency.

In particular, when the container 5 is a small reticle pod as in the present embodiment, the size of the flow rate measurement device 6 is also small according to the size of the container 5, so that the battery that can be installed on the flow rate measurement device 6 is also quite small. Accordingly, the range of the supporting portions 22 for which the flow rates can be measured together by power supplied from one battery is significantly narrowed. On the other hand, since the container 5 has a small size, the number of supporting portions 22 become enormous when the overall size of the storage rack 2 is constant. These factors in combination increase the number of batches necessary to perform the flow rate measurement of the cleaning gas for all of the supporting portions 22, resulting in a significant reduction in the inspection efficiency.

Therefore, the flow rate measurement system 1 of the present embodiment is configured to supply the power needed by the flow rate measurement device 6 from the transport device 3, and directly transmit the measured data obtained by the flow rate measurement device 6 to the transport device 3 side. The transport device 3 and the flow rate measurement device 6 are connected by a first cable 71. In the present embodiment, the first cable 71 that connects the transport device 3 and the flow rate measurement device 6 serves both as a power line and a communication line. In this sense, it can be said that the transport device 3 and the flow rate measurement device 6 are communicatively connected via the power line. From another aspect, it can be said that they are connected via the communication line so as to enable power supply. As such a first cable 71, it is possible to use, for example, an Ethernet cable constituted by a copper wire cable, an optical cable, or the like. In the present embodiment, the first cable 71 corresponds to the "power line".

Figure 7:
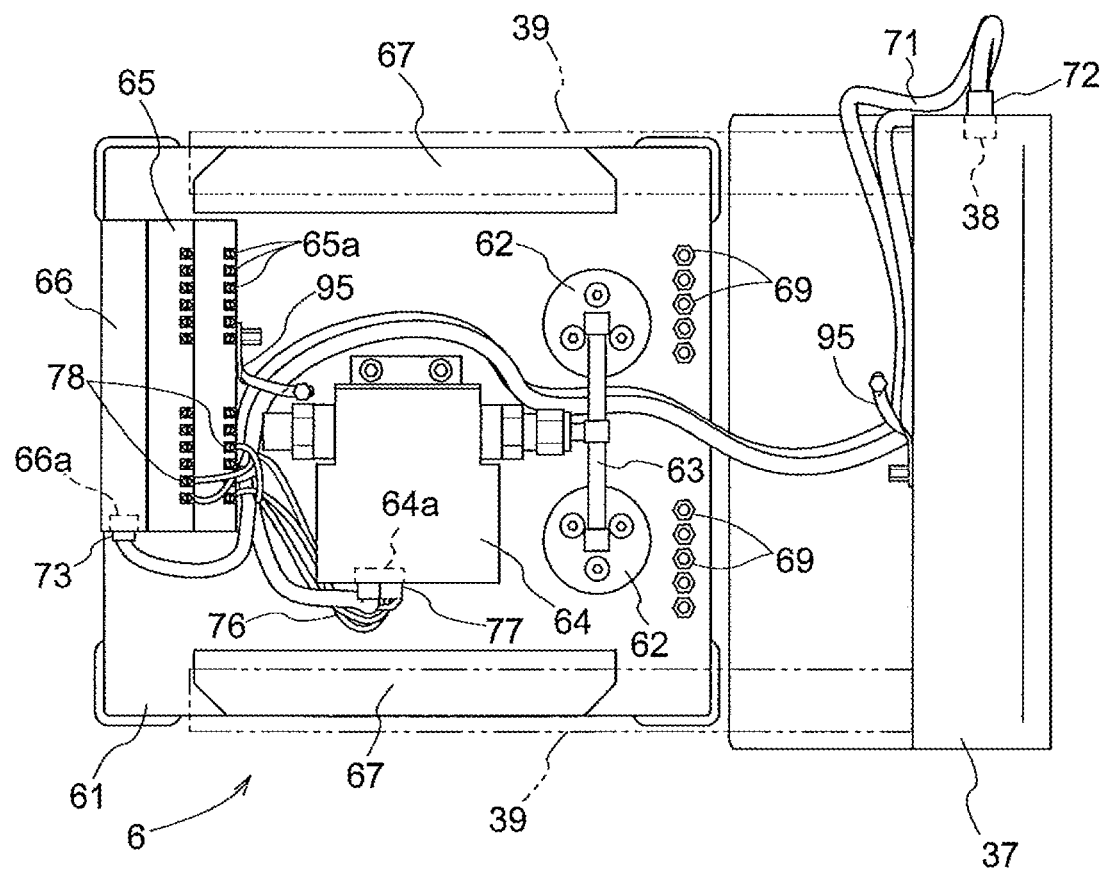
FIG. 7 is a plan view of the transfer device and the flow rate measurement device.

As shown in FIG. 7, the first cable 71 includes, at opposite ends thereof, a first connector 72 and a second connector 73. The first connector 72 is connected to a communication port 38 of a communication unit (not shown) contained in the support platform 37 of the transfer device 35. The second connector 73 is connected to a communication port 66a of an input/output device 66. In this manner, a part of the power constantly supplied to the transport device 3 in order to operate the power transport device 3 is supplied to the flow rate measurement device 6 via the transfer device 35 and the first cable 71.

In the flow rate measurement device 6, the terminal block 65 and the flowmeter 64, which are provided in the input/output device 66, are connected by the second cable 76. The second cable 76 may also serve as both a power line and a communication line. For example, it is possible to use an Ethernet cable. The second cable 76 includes, at opposite ends thereof, a first connector 77 and a second connector 78. The first connector 77 is connected to a communication port 64a of a communication unit (not shown) contained in the flowmeter 64. In the present example, the second connector 78 is separated into a plurality of pieces, which are respectively connected to the corresponding terminals 65a of the terminal block 65. In this manner, the power supplied from the transport device 3 side to the flow rate measurement device 6 via the first cable 71 is supplied to the flowmeter 64 via the input/output device 66 and the terminal block 65, as well as the second cable 76.

The length of the first cable 71 is set to a length with an allowance so as to be slightly longer (e.g., about 10% to 50% longer) than the shortest distance between the communication port 38 on the transfer device 35 side and the communication port 66a on the flow rate measurement device 6 side. The thickness of the first cable 71 is set to be small such that the first cable 71 can easily undergo bending deformation. Furthermore, taking also into consideration the relationship between the length and the thickness, the first cable 71 is fixed in a plurality of locations (in the present example, two locations) to each of the transfer device 35 and the terminal block 65 by using fixing means 95 as shown in FIG. 7. The length setting, the thickness setting, and the setting of the fixation position of the first cable 71 are determined such that the load acting on the supporting portion 22 is equivalent to the load applied by the self weight of the flow rate measurement device 6.

The flow rate measurement device 6 of the present embodiment is connected via the first cable 71 to the transport device 3 that is connected, for example, to a power system or a large-sized power storage facility (e.g., uninterruptible power supply) such that power is steadily supplied thereto. Accordingly, it is possible to stably supply power also to the flow rate measurement device 6. Thus, battery replacement, which poses a problem in such a case where power is supplied from a small battery installed in the flow rate measurement device 6, is not required, making it possible to efficiently perform the data measurement. At this time, even when the transport device 3 and the flow rate measurement device 6 are connected by the first cable 71, the load of the flow rate measurement device 6 that acts on the supporting portion 22 is hardly affected, thus making it possible to accurately perform the data measurement.

Furthermore, since the flow rate measurement device 6 and the transport device 3 are communicable with each other via the first cable 71, the measured data obtained by the flow rate measurement device 6 can be sequentially transmitted to the control portion 8 via the first cable 71 and the transport device 3. In this manner, the obtained measured data can be acquired in real-time by the control portion 8 by using the first cable 71 for supplying power to the flow rate measurement device 6.

Figure 8:
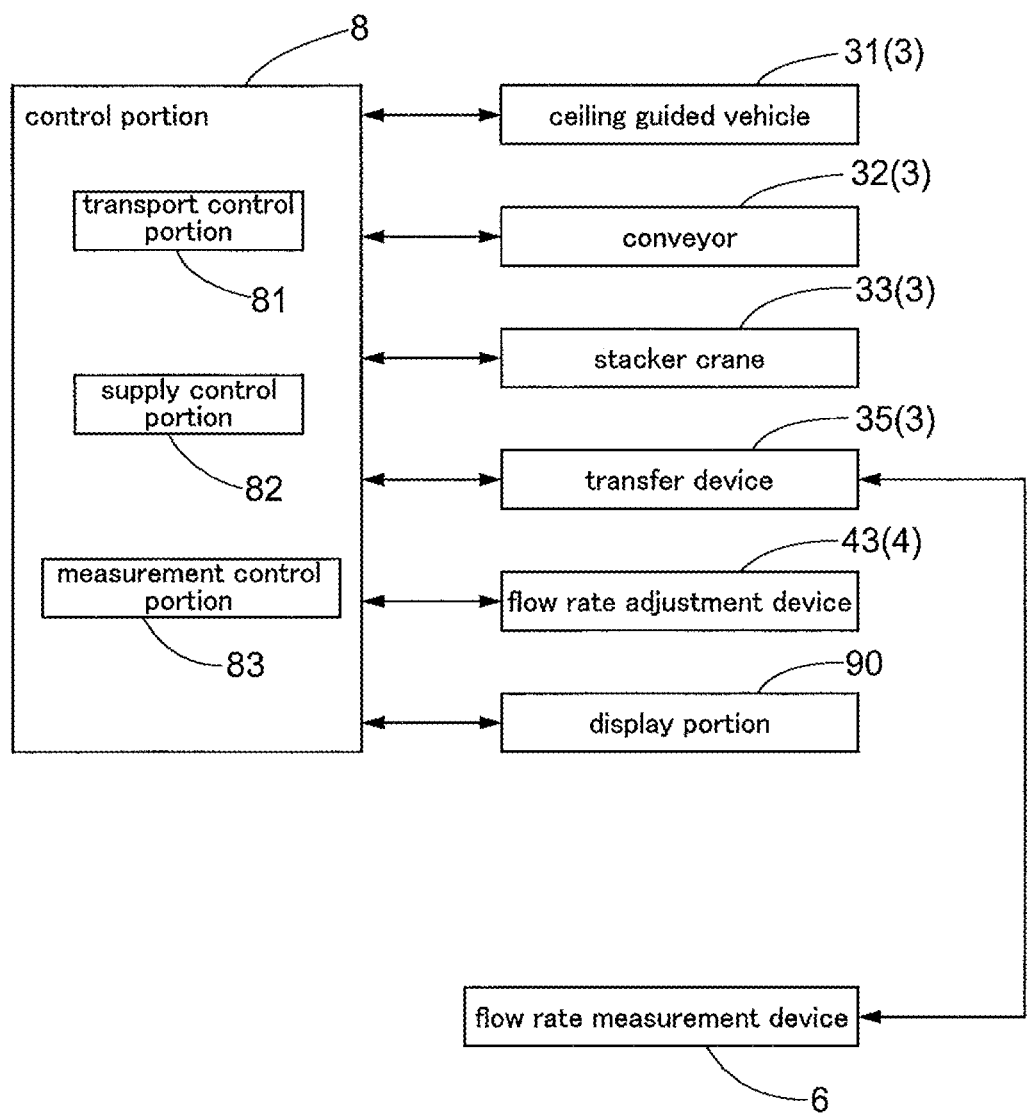
FIG. 8 is a block diagram showing a configuration of a control portion.

The flow rate measurement system 1 (container storage facility 10) further includes a control portion 8 and a display portion 90. The control portion 8 is constituted, for example, by a computer or a work station in which a control program is installed. The display portion 90 is constituted, for example, by a monitor connected to the control portion 8. As shown in FIG. 8, the control portion 8 includes a transport control portion 81, a supply control portion 82, and a measurement control portion 83. The transport control portion 81 controls the operation of the transport device 3. Based on a transport instruction, the transport control portion 81 cooperatively controls the operations of the ceiling guided vehicle 31, the conveyor 32, the stacker crane 33, and the transfer device 35 so as to transport the container 5 from the transport source to the transport destination, designated in the transport instruction.

The supply control portion 82 controls the operation of the gas supply device 4. As described above, the storage rack 2 is divided into a plurality of storage compartments 25 each including a plurality of supporting portions 22, and one flow rate adjustment device 43 is provided for each storage compartment 25. The supply control portion 82 individually controls the plurality of flow rate adjustment devices 43 so as to adjust the flow rate of the cleaning gas supplied to the discharge nozzle 47 installed at each of the supporting portions 22 for each storage compartment 25.

The measurement control portion 83 controls the operation of the transport device 3 involved in the flow rate measurement performed using the flow rate measurement device 6. In the case of performing the flow rate measurement using the flow rate measurement device 6, the measurement control portion 83 cooperatively controls, in conjunction with the transport control portion 81, the operations of the stacker crane 33 and the transfer device 35 so as to sequentially transport the flow rate measurement device 6 to the supporting portions 22. Then, in a state in which the transport device 3 has transported the flow rate measurement device 6 and the flow rate measurement device 6 is placed on the target supporting portion 22S selected from among the plurality of supporting portions 22, the flow rate measurement device 6 measures the flow rate of the cleaning gas. At this time, in order to prevent breakage of the first cable 71 during the flow rate measurement, the measurement control portion 83 prohibits the transport operation of the transport device 3 during flow rate measurement performed by the flow rate measurement device 6.

The measured data obtained by the flow rate measurement device 6 is transmitted in real-time to the control portion 8 via the first cable 71. Then, the control portion 8 is configured to display the received measured data on the display portion 90. By doing so, it is possible to inform in real-time the operator of the measured data during the measurement, or inform the operator of the measured data after the measurement without delay. Accordingly, the operator can roughly determine the suitability of the measured data at an early stage. For example, when an abnormality is observed in the measured data immediately after start of the inspection, the measurement can be interrupted, and countermeasures such as reviewing the whole system can be taken. As a result, even if there is an abnormality, the abnormality can be improved at an early stage.

When the data on the measurement results obtained in the batches are integrated at the end to obtain a complete set of measured data as in the flow rate measurement system having the conventional specifications described above, it is difficult to determine the suitability of the measured data in the middle of the inspection. Therefore, there may be cases where an abnormality is found only after obtaining a complete set of measured data over a long period of time. If such a situation arises, there will be a very large amount of time loss. In this respect, with the flow rate measurement system 1 of the present embodiment, an abnormality such as being unable to obtain the target flow rate can be found at an early stage. Accordingly, even if there is an abnormality, the time required to complete the inspection after eliminating the abnormality can be significantly shortened.

A specific procedure for the flow rate measurement targeting all the supporting portions 22 may be set as appropriate. In the flow rate measurement system 1 of the present embodiment, three inspection modes, namely, a normal mode, a first retry mode, and a second retry mode, can be selected, and the selection of the inspection modes is made by the operator.

The normal mode is an inspection mode in which the flow rate measurement device 6 is simply transported sequentially to all the supporting portions 22, and the flow rates of the cleaning gas in the supporting portions 22 are sequentially measured. In the normal mode, the flow rates of the cleaning gas in all the supporting portions 22 are inspected at once, without individually determining the suitability of the measured data in the supporting portions 22.

The first retry mode and the second retry mode are inspection modes corresponding to the normal mode to which a self-diagnosis function for individually determining the suitability of the measured data in the supporting portions 22 is added. In the first retry mode, self-diagnosis is performed immediately after performing the flow rate measurement in each of the supporting portions 22, and a retry is performed each time it is determined that there is an abnormality. In the second retry mode, first, self-diagnosis is performed as needed while sequentially performing the flow rate measurement in the supporting portions 22, and, retries are performed together at the end for the supporting portions 22 for which it is determined that there is an abnormality. To perform these retries, the flow rate of the cleaning gas is remeasured after replacing the flow rate measurement device 6 on the target supporting portion 22S by the transport device 3. Note that "to replace" basically refers to temporality raising the flow rate measurement device 6 from a target supporting portion 22S and thereafter lowering the flow rate measurement device 6 to be placed on the same target supporting portion 22S again. However, in the case of transferring the flow rate measurement device 6 to another target supporting portion 22S as in the second retry mode, "to replace" also includes replacement involved in such transfer.

Figure 9:
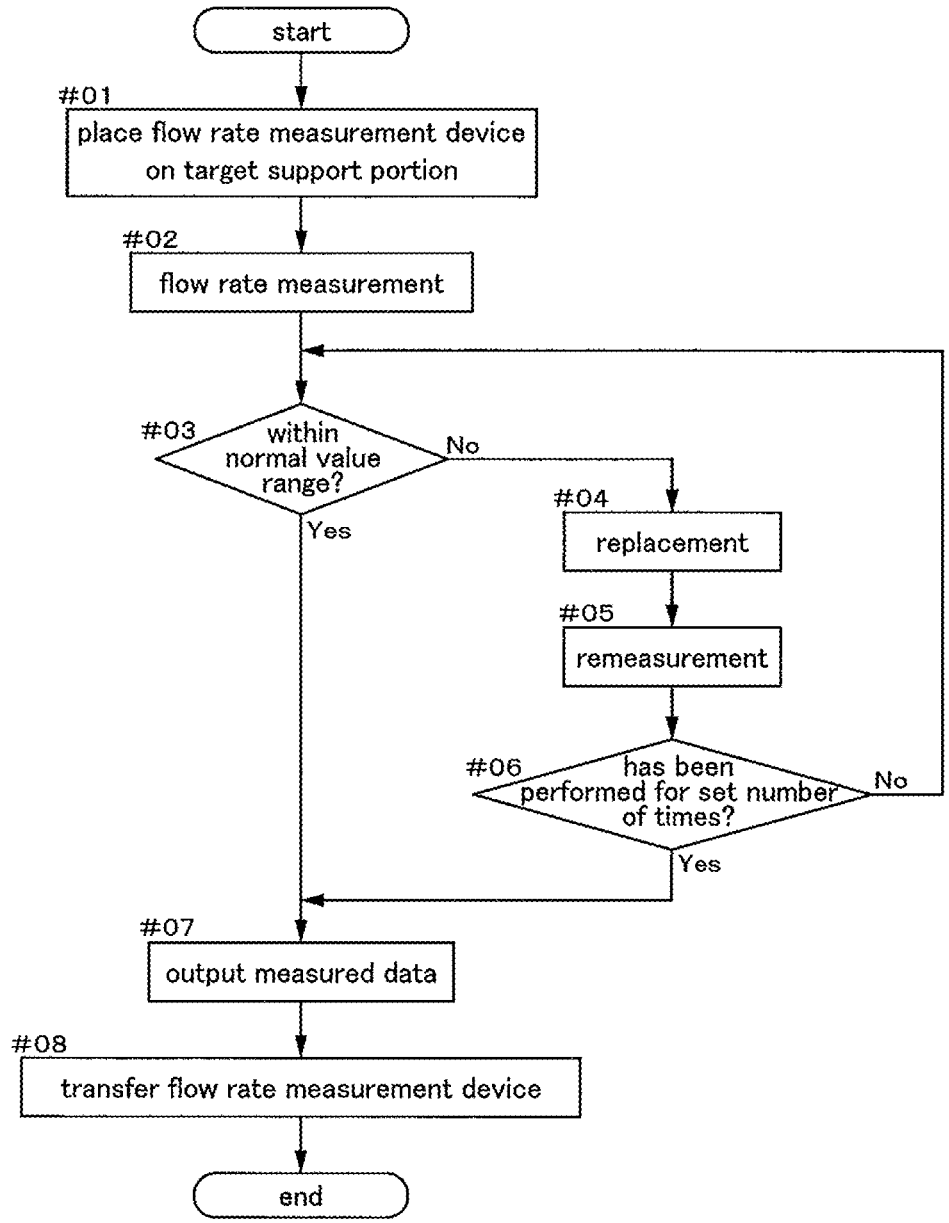
FIG. 9 is a flowchart illustrating a processing procedure for a first retry mode.

The processing procedure for the first retry mode is shown in FIG. 9. As shown in the drawing, first, the flow rate measurement device 6 is placed on one target supporting portion 22S (step #01). Then, in a state in which the flow rate measurement device 6 is placed on the target supporting portion 22S, the flow rate measurement is performed (#02). For the obtained measured data, it is determined whether the measurement date falls within a normal value range (#03). The normal value range can be, for example, a range of ±10% based on the target flow rate as a reference. Of course, the normal value range may be appropriately set according to the desired level of precision.

If it is determined that the measured data falls outside the normal value range (#03: No), the flow rate measurement device 6 is replaced on the same target supporting portion 22S by the transport device 3 (#04). Then, in a state in which the flow rate measurement device 6 is placed on the target supporting portion 22S, the flow rate measurement is performed again (#05). Such a retry after replacement is performed until the measured data falls within the normal value range (#03: Yes) or until the number of retries reaches a predetermined set number of times (#06: Yes). The set number of times may be set as appropriate, but may be preferably once to three times, for example.

Thereafter, the measured data that falls within the normal value range or the measured data obtained after performing retries for the set number of times is output to the control portion 8 via the first cable 71 (#07). The control portion 8 records the obtained measured data in association with the target supporting portion 22S. Upon completion of the flow rate measurement in one target supporting portion 22S in this manner, the flow rate measurement device 6 is transferred to another target supporting portion 22S by the transport device 3 (#08). The above-described processing procedure is repeatedly executed until the flow rate measurement is completed in all the supporting portions 22.

Thus, in the first retry mode, if the obtained measured data falls outside the predetermined normal value range, the control portion 8 (measurement control portion 83) remeasures the flow rate of the cleaning gas after replacing the flow rate measurement device 6 on the target supporting portion 22S for the predetermined set number of times. On the other hand, if the measured data falls within the normal value range, the control portion 8 (measurement control portion 83) selects a new supporting portion 22 as the target supporting portion 22S, transfers the flow rate measurement device 6 to the target supporting portion 22S, and measures the flow rate of the cleaning gas. In the first retry mode, if there is a measurement abnormality caused by an inappropriate placement state of the flow rate measurement device 6, for example, the abnormality can be improved at an early stage by a retry performed each time such an abnormality occurs.

Figure 10:
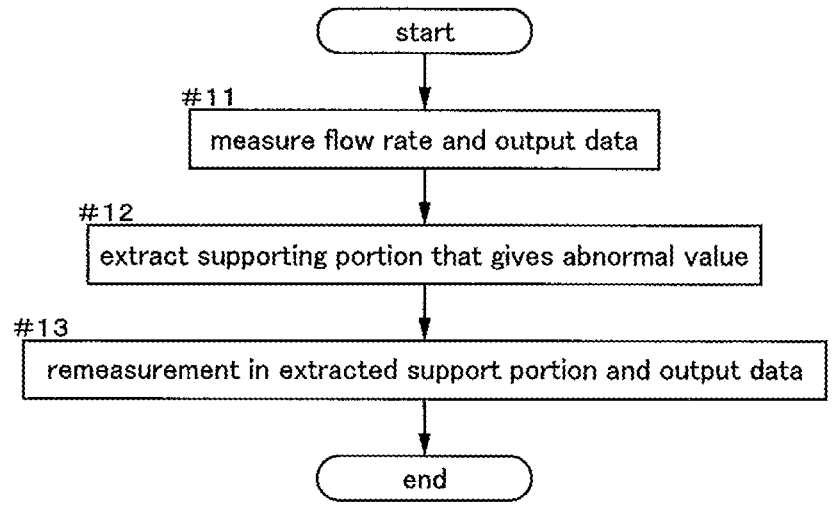
FIG. 10 is a flowchart illustrating a processing procedure for a second retry mode.

The processing procedure for the second retry mode is shown in FIG. 10. As shown in the drawings, the flow rate measurement is performed in a state in which the flow rate measurement device 6 has been sequentially transferred to all the supporting portions 22, and the flow rate measurement device 6 is placed on each of the supporting portions 22 (target supporting portion 22S), and the measured data is output (#11). This series of processes correspond to the repeated execution of the processes at steps #01, #02, #07, and #08 in the first retry mode. Upon completion of the flow rate measurement in all the supporting portions 22, the supporting portions 22 that give the measured data that falls outside the normal value range are extracted (#12). Then, remeasurement is performed in a state in which the flow rate measurement device 6 has been sequentially transferred to the extracted supporting portions 22, and the flow rate measurement device 6 is placed on each of the supporting portions 22 (target supporting portion 22S), and the measured data is output again (#13). The control portion 8 overwrites the original measured data that falls outside the normal value range with the latest measured data obtained for each of the supporting portions 22.

Thus, in the second retry mode, the control portion 8 (measurement control portion 83) extracts, from among all the supporting portions 22 for which the flow rate of the cleaning gas has been measured as the target supporting portion 22S, the supporting portions 22 for which the obtained measured data falls outside the predetermined normal value range. Then, the control portion 8 (measurement control portion 83) sequentially transfers the flow rate measurement device 6 to the extracted supporting portions 2, and sequentially measures the flow rate of the cleaning gas in the supporting portions 22. In the second retry mode, the measured data for all the supporting portions 22 can be obtained at an early stage. At the same time, if there is a measurement abnormality caused, for example, by an inappropriate placement state of the flow rate measurement device 6, the abnormal value can be efficiently corrected by retries that are performed together at the end.

Furthermore, in the above-described inspection modes, a handling function for providing a simple handling when the flow rate adjustment device 43 is suspected of an abnormality may be added. That is, a diagnostic handling mode for implementing such a handling function may be included in each of the above-described inspection modes.

Figure 11:
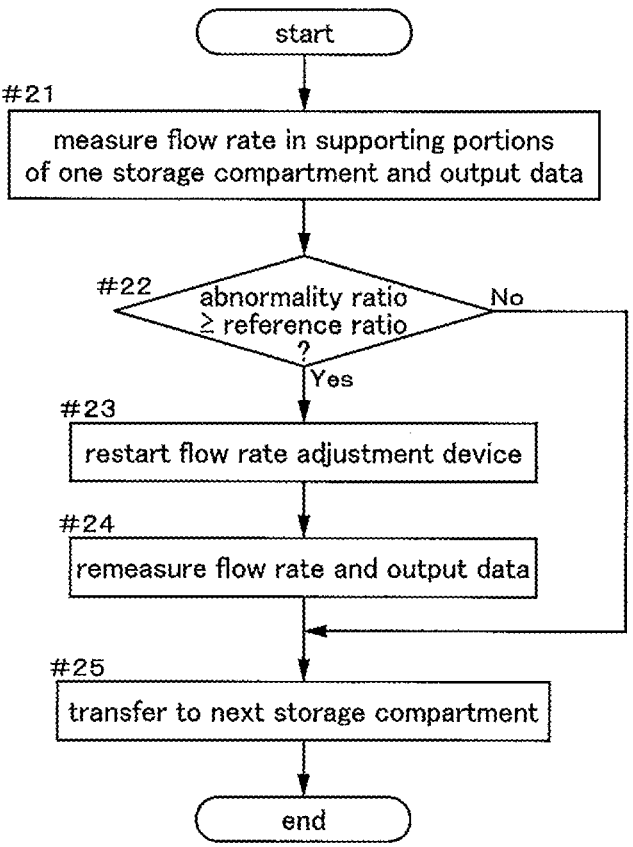
FIG. 11 is a flowchart illustrating a processing procedure for a diagnostic handling mode.

The processing procedure for the diagnostic handling mode executed for each storage compartment 25 is shown in FIG. 11. As shown in the drawing, first, in a state in which the flow rate measurement device 6 has been sequentially transferred to all the supporting portions 22 included in one storage compartment 25, and the flow rate measurement device 6 is placed on each of the supporting portions 22 (target supporting portion 22S), the flow rate measurement is performed, and the measured data was output (#21). Upon completion of the flow rate measurement in all the supporting portions 22 in the storage compartment 25, it is determined whether the ratio (abnormality ratio) of the supporting portions 22 that give the measured data that falls outside the normal value range is greater than or equal to a predetermined reference ratio (#22).

The reference ratio may be set as appropriate, but may be 80%, for example.

If the abnormality ratio is greater than or equal to the reference ratio (#22: Yes), there is the possibility that some abnormality occurs in the flow rate adjustment device 43 provided so as to correspond to that storage compartment 25. Therefore, in such a case, the flow rate adjustment device 43 is restarted (#23). After the restart, when the state of the flow rate adjustment device 43 has stabilized, remeasurement is performed for all the supporting portions 22 included in the storage compartment 25, and the measured data is output again (#24). The control portion 8 overwrites the original measured data with the obtained latest measured data for each of the supporting portions 22. Upon completion of remeasurement in the supporting portions 22 included in one storage compartment 25 in this manner, the flow rate measurement device 6 is transferred to a supporting portion 22 included in another storage compartment 25 by the transport device 3 (#25).

Thus, in the diagnostic handling mode, for each of the storage compartments 25, if the obtained measured data falls outside the predetermined normal value range in a number of the supporting portions 22 within the storage compartment 25 that is greater than or equal to the predetermined reference ratio, the control portion 8 (measurement control portion 83) restarts the flow rate adjustment device 43 assigned to the storage compartment 25, and remeasures the flow rate of the cleaning gas in the supporting portions 22 included in the storage compartment 25. In the diagnostic handling mode, it is possible to increase the probability that an abnormality of the measured data that is caused by an abnormality of the flow rate adjustment device 43 can be eliminated at an early stage.

Other Embodiments (1) The above embodiment is described, taking, as an example, a configuration in which the first cable 71 that connects the transport device 3 and the flow rate measurement device 6 serves both as the power line and the communication line. However, the present disclosure is not limited to such a configuration. For example, the first cable 71 may serve as a dedicated power line, and a dedicated communication line that connects the transport device 3 and the flow rate measurement device 6 may be provided separately. Alternatively, when the first cable 71 serves as a dedicated power line, the transport device 3 and the flow rate measurement device 6 may be configured to be communicable with each other by wireless communication.

(2) The above embodiment is described, taking, as an example, a configuration in which the flow rate measurement system 1 (container storage facility 10) includes the display portion 90, and the measured data obtained by the flow rate measurement device 6 is displayed in real-time on the display portion 90. However, the present disclosure is not limited to such a configuration, and the measured data does not need to be displayed in real-time on the display portion 90. Alternatively, in some cases, the installation of the display portion 90 may be omitted.

(3) The above embodiment is described, taking, as an example, a configuration in which three inspection modes, namely, the normal mode, the first retry mode, and the second retry mode can be selected. However, the present disclosure is not limited to such a configuration, and it is also possible to adopt a configuration in which only one or two of these inspection modes can be selected. Alternatively, it is possible to adopt a configuration in which a different mode other than these modes can be selected. Examples of the different mode include an analysis mode in which when a flow rate abnormality is observed, the cause of the abnormality is investigated, and a countermeasure mode in which when a flow rate abnormality is observed, the abnormality is improved by gas purging, brushing, or the like.

(4) The above embodiment is described, taking, as an example, a configuration in which each of the inspection modes includes the diagnostic handling mode. However, the present disclosure is not limited to such a configuration, and at least one inspection mode does not need to include the diagnostic handling mode.

(5) The above embodiment is described, taking, as an example, a configuration in which when a flow rate abnormality is observed in the first retry mode, the flow rate measurement device 6 is replaced and remeasurement is performed. However, the present disclosure is not limited to such a configuration, and it is possible to adopt a configuration in which when a flow rate abnormality is observed, the inspection is interrupted, for example. In this case, it is possible to adopt a configuration in which an alarm is displayed or sounded in order to notify the operator of the interruption of the inspection due to the flow rate abnormality.

(6) The above embodiment is descried, taking, as an example, a configuration in which the container 5 is a small reticle pod that houses a reticle. However, the present disclosure is not limited to such a configuration, and the container 5 may be, for example, a FOUP (Front Opening Unified Pod) that stores a plurality of semiconductor wafers, or may be a container that houses food products, medical and pharmaceutical products, or the like.

(7) The configurations disclosed in the embodiments described above (including Embodiment and Other Embodiments described above; the same also applies to the following) are applicable in combination with configurations disclosed in other embodiments as long as no inconsistency arises. With regard to the other configurations as well, the embodiments disclosed herein are in all respects as illustrative, and appropriate changes and modifications may be made thereto without departing from the scope and sprit of the present disclosure.

Outline of the Embodiment

To summarize the foregoing, preferably, a flow rate measurement system according to the present disclosure include the following configurations.

A flow rate measurement system that measures, by using a flow rate measurement device, a flow rate of cleaning gas supplied from a gas supply device in a container storage facility including: a storage rack including a plurality of supporting portions; a transport device that transports a container to a target supporting portion selected from the plurality of supporting portions; and the gas supply device that supplies the cleaning gas to the container supported by each of the plurality of supporting portions, wherein the transport device and the flow rate measurement device are connected via a power line communicatively by wire or wireless, and the flow rate measurement device measures the flow rate of the cleaning gas in a state in which the transport device has transported the flow rate measurement device in place of the container and the flow rate measurement device is placed on the target supporting portion.

With this configuration, in a state in which the flow rate measurement device is placed on the target supporting portion, the flow rate measurement is performed in the same state as the state in which the container is supported by the supporting portion. Accordingly, it is possible to accurately measure the flow rate of the supplied cleaning gas. While a transport device that transports a container is usually connected, for example, to a power system or the like and power is steadily supplied therefrom, the transport device and the flow rate measurement device are connected via a power line. Accordingly, power is also stably supplied to the flow rate measurement device via the transport device. Consequently, battery replacement, which poses a problem when power is supplied toe the flow rate measurement device from a small battery, for example, is not required, making it possible to efficiently perform the data measurement. Furthermore, while a transport device that transports a container is usually communicatively connected to a control device, the transport device and the flow rate measurement device are communicable with each other. Accordingly, measured data obtained by the flow rate measurement device can be sequentially transmitted to the control device via the transport device. Consequently, the processing for integrating the measured data on the control device side, which poses a problem in such a case where the flow rate measurement is performed in a plurality of batches, is not required, making it possible to efficiently obtain a complete set of measured data.

As an aspect, it is preferable that the container storage facility further includes: a control portion that controls operations of the transport device and the gas supply device; and a display portion, measured data obtained by the flow rate measurement device is transmitted in real-time to the control portion, and the control portion displays the received measured data on the display portion.

With this configuration, it is possible to inform in real-time the operator of the measured data during the measurement, or inform the operator of the measured data after the measurement without delay. Accordingly, the operator can roughly determine the suitability of the measured data at an early stage. For example, when an abnormality is observed in the measured data immediately after start of the inspection, the measurement can be interrupted, and countermeasures such as reviewing the whole system can be taken. As a result, even if there is an abnormality, the abnormality can be improved at an early stage. In this respect as well, it is possible to efficiently obtain a complete set of measured data.

As an aspect, it is preferable that the container storage facility further includes a control portion that controls operations of the transport device and the gas supply device, measured data obtained by the flow rate measurement device is transmitted in real-time to the control portion, and, if the obtained measured data falls outside a predetermined normal value range, the control portion remeasures the flow rate of the cleaning gas after replacing the flow rate measurement device on the target supporting portion for a predetermined set number of times, and, if the measured data falls within the normal value range, the control portion selects a new one of the supporting portion as the target supporting portion, transfers the flow rate measurement device to the target supporting portion, and measures the flow rate of the cleaning gas.

With this configuration, by repeating the procedure for transferring the flow rate measurement device to a new supporting portion and measuring the flow rate of the cleaning gas, on condition that the measured data falls within the normal value range, it is possible to automate the data measurement and the determination of the suitability thereof, making it possible to efficiently obtain a complete set of measured data. If the measured data falls outside the normal value range, remeasurement is performed after replacing the flow rate measurement device. Accordingly, if there is a measurement abnormality caused by an inappropriate placement state of the flow rate measurement device, for example, the abnormality can be improved at an early stage by a retry performed each time such an abnormality occurs.

As an aspect, it is preferable that the container storage facility further includes a control portion that controls operations of the transport device and the gas supply device, measured data obtained by the flow rate measurement device is transmitted to the control portion, and the control portion extracts, from among all the supporting portions in which the flow rate of the cleaning gas has been measured as the target supporting portions, the supporting portions for which the obtained measured data falls outside a predetermined normal value range, sequentially transfers the flow rate measurement device to the extracted supporting portions, and sequentially measures the flow rate of the cleaning gas in the supporting portions.

With this configuration, the flow rates of the cleaning gas in the supporting portions for which the measured data falls outside the normal value range can be remeasured together. Accordingly, for example, the measured data in all the supporting portions can be obtained at an early stage, and, even if there is a measurement abnormality caused by an inappropriate placement state, the abnormal values can be efficiently corrected by retries that are performed together at the end.

As an aspect, it is preferable that the storage rack is divided into a plurality of storage compartments each including the plurality of supporting portions, the gas supply device is configured to supply, in parallel, the cleaning gas whose flow rate has been adjusted by a flow rate adjustment device used in common for the plurality of supporting portions included in each one of the storage compartments, the container storage facility further includes a control portion that controls operations of the transport device and the gas supply device, measured data obtained by the flow rate measurement device is transmitted in real-time to the control portion, and, for each of the storage compartments, if the obtained measured data falls outside a predetermined normal value range in a number of the supporting portions within the storage compartment that is greater than or equal to a predetermined reference ratio, the control portion restarts the flow rate adjustment device assigned to the storage compartment, and remeasures the flow rate of the cleaning gas in the supporting portions included in the storage compartment.

If the obtained measured data falls outside the normal value range in a number of the supporting portions included in the plurality of supporting portions within the storage compartment that is greater than or equal to the reference ratio, there is the possibility that some abnormality occurs in the flow rate adjustment device used in common for these supporting portions. In this respect, with the above-described configuration, in such a case, remeasurement in each of the supporting portions is performed after restarting the flow rate adjustment device in the storage compartment. Accordingly, the probability that an abnormality of the measured data that is caused by an abnormality of the flow rate adjustment device can be eliminated at an early stage is increased.

As an aspect, it is preferable that the control portion prohibits a transport operation of the transport device during measurement of the flow rate of the cleaning gas performed by the flow rate measurement device.

With this configuration, it is possible to avoid the occurrence of such a situation where the transport device moves during the flow rate measurement performed by the flow rate measurement device, thus causing breakage of the power line between the transport device and the flow rate measurement device.

As an aspect, it is preferable that at least one of a length of the power line, a thickness of the power line, and a position at which the power line is fixed is set such that a load acting on the target supporting portion is equivalent to a load applied by the self weight of the flow rate measurement device.

With this configuration, even when the transport device and the flow rate measurement device are connected by the power line, it is possible that the load of the flow rate measurement device that acts on the target supporting portion is hardly affected. Accordingly, it is possible to accurately measure the flow rate of the cleaning gas in a state in which only a load substantially equal to the load applied by the self weight of the flow rate measurement device acts on the target supporting portion.

It is sufficient that the flow rate measurement system according to the present disclosure can achieve at least one of the above-described effects.

What is claimed is:

1. A flow rate measurement system that measures, by using a flow rate measurement device, a flow rate of cleaning gas supplied from a gas supply device in a container storage facility comprising: a storage rack including a plurality of supporting portions; a transport device that transports a container to a target supporting portion selected from the plurality of supporting portions; and the gas supply device that supplies the cleaning gas to the container supported by each of the plurality of supporting portions, wherein:

the transport device and the flow rate measurement device are connected via a power line, and are connected communicatively by wire or wireless, and the flow rate measurement device measures the flow rate of the cleaning gas in a state in which the transport device has transported the flow rate measurement device in place of the container and the flow rate measurement device is placed on the target supporting portion.

2. The flow rate measurement system according to claim 1, wherein:

the container storage facility further comprises: a control portion that controls operations of the transport device and the gas supply device; and a display portion, measured data obtained by the flow rate measurement device is transmitted in real-time to the control portion, and the control portion displays the received measured data on the display portion.

3. The flow rate measurement system according to claim 2, wherein the control portion prohibits a transport operation of the transport device during measurement of the flow rate of the cleaning gas performed by the flow rate measurement device.

4. The flow rate measurement system according to claim 1, wherein:

the container storage facility further comprises a control portion that controls operations of the transport device and the gas supply device, measured data obtained by the flow rate measurement device is transmitted in real-time to the control portion, and, if the obtained measured data falls outside a predetermined normal value range, the control portion remeasures the flow rate of the cleaning gas after replacing the flow rate measurement device on the target supporting portion for a predetermined set number of times, and, if the measured data falls within the normal value range, the control portion selects a new one of the supporting portion as the target supporting portion, transfers the flow rate measurement device to the target supporting portion, and measures the flow rate of the cleaning gas.

5. The flow rate measurement system according to claim 1, wherein:

the container storage facility further comprises a control portion that controls operations of the transport device and the gas supply device, measured data obtained by the flow rate measurement device is transmitted to the control portion, and the control portion extracts, from among all the supporting portions in which the flow rate of the cleaning gas has been measured as the target supporting portions, the supporting portions for which the obtained measured data falls outside a predetermined normal value range, sequentially transfers the flow rate measurement device to the extracted supporting portions, and sequentially measures the flow rate of the cleaning gas in the supporting portions.

6. The flow rate measurement system according to claim 1, wherein:
the storage rack is divided into a plurality of storage compartments each including the plurality of supporting portions,
the gas supply device is configured to supply, in parallel, the cleaning gas whose flow rate has been adjusted by a flow rate adjustment device used in common for the plurality of supporting portions included in each one of the storage compartments,
the container storage facility further comprises a control portion that controls operations of the transport device and the gas supply device,
measured data obtained by the flow rate measurement device is transmitted in real-time to the control portion, and,
for each of the storage compartments, if the obtained measured data falls outside a predetermined normal value range in a number of the supporting portions within the storage compartment that is greater than or equal to a predetermined reference ratio, the control portion restarts the flow rate adjustment device assigned to the storage compartment, and remeasures the flow rate of the cleaning gas in the supporting portions included in the storage compartment.

7. The flow rate measurement system according to claim 1, wherein at least one of a length of the power line, a thickness of the power line, and a position at which the power line is fixed is set such that a load acting on the target supporting portion is equivalent to a load applied by the self weight of the flow rate measurement device.

* * * * *